United States Patent
Hasegawa

[11] Patent Number: 5,872,402
[45] Date of Patent: Feb. 16, 1999

[54] INTERLAYER INSULATING FILM FOR SEMICONDUCTOR DEVICE

[75] Inventor: Toshiaki Hasegawa, Kanagawa, Japan

[73] Assignee: Sony Corporation, Japan

[21] Appl. No.: 651,786

[22] Filed: May 24, 1996

[30] Foreign Application Priority Data

May 30, 1995 [JP] Japan .................................. 7-131419

[51] Int. Cl.[6] .......................... H01L 23/48; H01L 23/52; H01L 29/40
[52] U.S. Cl. .......................... 257/758; 257/750; 257/760
[58] Field of Search .................. 257/758, 750, 257/522, 632, 760; 438/618, 622, 623, 624

[56] References Cited

U.S. PATENT DOCUMENTS

| | | | |
|---|---|---|---|
| 5,338,975 | 8/1994 | Cole, Jr. et al. | 257/750 |
| 5,407,860 | 4/1995 | Stoltz et al. | 438/619 |
| 5,512,775 | 4/1996 | Cho | 257/522 |
| 5,523,615 | 6/1996 | Cho et al. | 257/758 |
| 5,548,159 | 8/1996 | Jeng | 257/758 |
| 5,616,959 | 4/1997 | Jeng | 257/758 |
| 5,625,232 | 4/1997 | Numata et al. | 257/758 |
| 5,708,303 | 1/1998 | Jeng | 257/758 |

*Primary Examiner*—Olik Chaudhuri
*Assistant Examiner*—Phat X. Cao
*Attorney, Agent, or Firm*—Ronald P. Kananen

[57] ABSTRACT

Disclosed is an interlayer insulating film using low dielectric constant films, which can be improved in rigidity without any effect exerted on the reliability of a semiconductor device. The interlayer insulating film, which is formed in such a manner as to cover surroundings of interconnections formed on the semiconductor device, includes low dielectric constant films, each having a dielectric constant of from 1 to 3.5, which are formed in surroundings of the interconnections and between the interconnections; and a supporting layer formed in or through at least one of the low dielectric constant films formed on the upper and lower sides of the interconnections.

13 Claims, 6 Drawing Sheets

INTERLAYER INSULATING FILM FOR SEMICONDUCTOR DEVICE

BACKGROUND OF THE INVENTION

The present invention relates to an interlayer insulating film for insulating interconnections from each other in a semiconductor device, and particularly to an interlayer insulating film for a semiconductor device which is used for a device process based on a design rule of 0.25 μm or less.

The reduction in dielectric constant of an interlayer insulating film has been examined with requirements toward finer-line geometries, reduced power consumption and increased operating speed of a semiconductor device.

Low dielectric constant materials disclosed at present are of a type containing carbon atoms or fluorine atoms for reducing the dielectric constant thereof. The dielectric constant of such a material put in practical use is substantially in a range of from 1.5 to 2.5.

Examples of low dielectric constant materials containing carbon atoms include organic SOG (Spin On Glass), fluorocarbon polymer, polyimide, and polyparaxylylene. It is known that such a material is low in density because it contains carbon atoms as an alkyl group, and it is also known that the material is low in dielectric constant because the polarizability of molecules themselves is low. Such a material being low in dielectric constant has also a high heat resistance essential as the material for a semiconductor device. The heat resistances of organic SOG, polyimide, and fluorocarbon polymer and polyparaxylylene are due to a siloxane structure, imide bonding, and benzene ring, respectively.

On the other hand, silicon oxyfluoride (SiOF) is known as a low dielectric constant material containing fluorine atoms. This material is low in density because the Si—O—Si bonding is terminated with fluorine atoms, and is low in dielectric constant because the polarizability of fluorine itself is low. The material is of course excellent in heat resistance.

The above-described related art low dielectric constant film exerts adverse effect on the reliability of a semiconductor device as compared with a related art interlayer insulating film (silicon oxide) used for a semiconductor device. The low dielectric constant film made of SiOF being silicon oxide containing fluorine atoms is known to be relatively excellent in film quality; however, it is not sufficient yet in moisture resistance and in stability against fluorine. The organic material is also poor in heat resistance, oxygen plasma resistance and rigidity.

SUMMARY OF THE INVENTION

An object of the present invention is to provide a interlayer insulating film for a semiconductor device, which is high in reliability and excellent in rigidity.

To achieve the above object, according to a preferred mode of the present invention, there is provided an interlayer insulating film for a semiconductor device, which is formed in such a manner as to cover surroundings of interconnections formed on the semiconductor device, including: low dielectric constant films, each having a dielectric constant of from 1 to 3.5, which are formed in surroundings of the interconnections and between the interconnections; and a supporting layer formed in or through at least one of the low dielectric constant films formed on the upper and lower sides of the interconnections.

In the above-described interlayer insulating film for a semiconductor device, low dielectric constant films having a dielectric constant of from 1 to 3.5 are formed in surroundings and between interconnections, and thereby a capacitance between interconnections is reduced. In addition, any material having a dielectric constant of 1 or less is not in existence. On the other hand, the interlayer insulating film using low dielectric constant films having a dielectric constant larger than 3.5 is little different from the related art interlayer insulating film using silicon oxide, and thereby it is not expected to be reduced in capacitance between interconnections.

Moreover, in the above-described interlayer insulating film for a semiconductor device, a supporting layer is formed in at least one of low dielectric constant films formed on the upper and lower sides of interconnections, and the rigidity of the interlayer insulating film is enhanced by the presence of the supporting layer.

DETAILED DESCRIPTION OF THE PREFERRED EMBODIMENTS

A first embodiment of the present invention will be described with reference to a schematic sectional view of FIG. 1.

Figure 1:
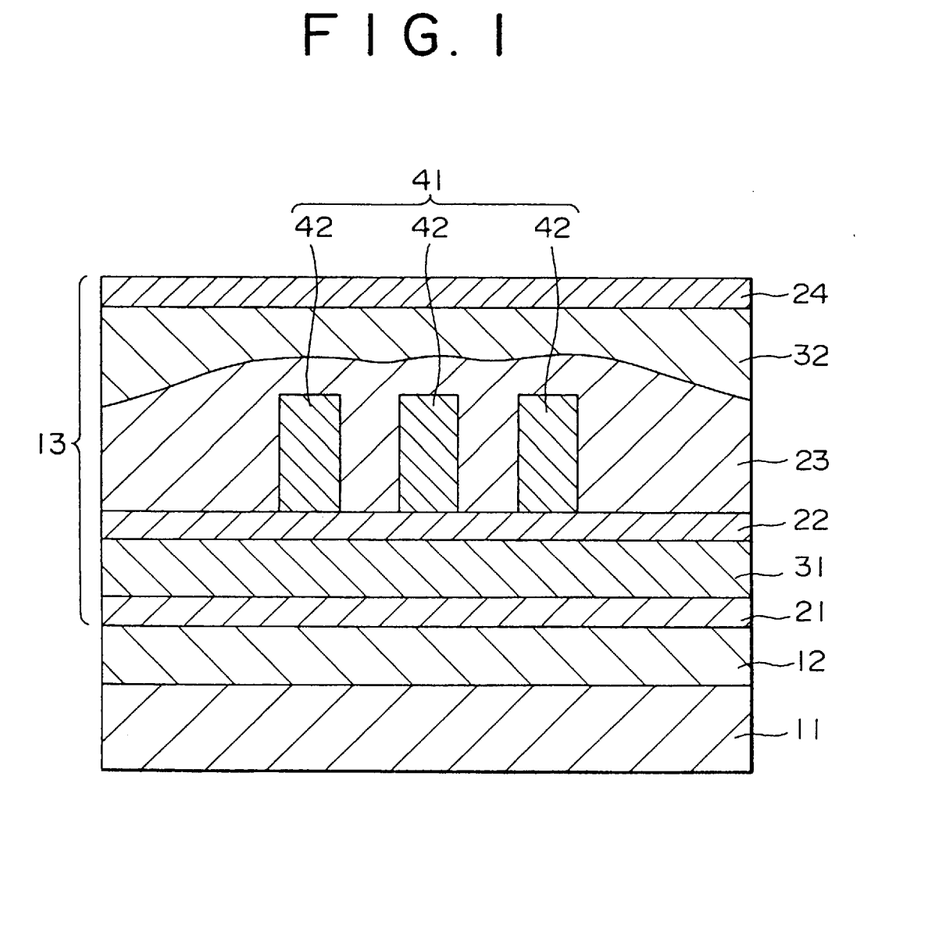
FIG. 1 is a schematic sectional view of the configuration of a first embodiment of the present invention.

Referring to FIG. 1, a silicon oxide film as an insulating film 12 is formed on a substrate (for example, silicon substrate) 11.

A first low dielectric constant film 21 is formed on the insulating film 12, and a first supporting layer 31 is formed on the first low dielectric constant film 21. The first low dielectric constant film 21, which is made of benzocyclobutene (hereinafter, referred to as "BCB") having a dielectric constant of about 2.6, is formed to a thickness of for example 150 nm. The first supporting layer 31, which is made of a material such as silicon oxide being high in heat resistance, moisture resistance, hardness, and insulating performance, being low in compressive stress, and being excellent in workability, is formed to a thickness of for example 300 nm. A second low dielectric constant film 22 made of BCB like the first low dielectric constant film 21 is formed on the first supporting layer 31 to a thickness of for example 150 nm.

Accordingly, the first supporting layer 31 is formed at a position nearly intermediate between the first low dielectric constant film 21 and the second low dielectric constant film 22.

A lower half of an interlayer insulating film 13, positioned on the lower side of an interconnection layer 41, is composed of the first and second low dielectric films 21, 22 and the first supporting layer 31, and it has a film thickness similar to that (=600 nm) of a related art interlayer insulating film made of only silicon oxide.

A plurality of interconnections 42 as the interlayer insulating layer 41 are formed on the second low dielectric constant film 22.

A third low dielectric constant film 23 made of BCB like the first low dielectric constant film 21 is formed in such a manner as to cover each interconnection 42. At this time, the thickness of the third low dielectric constant film 23 from the interconnections 42 is set at for example 150 nm.

A second supporting layer 32 made of silicon oxide having the same property as that of silicon oxide used for the first supporting layer 31 is formed on the third low dielectric constant film 23 to a thickness of, for example 150 nm, and the surface of the second supporting layer 32 is planarized.

A fourth low dielectric constant film 24 made of BCB like the first low dielectric constant film 21 is formed on the upper surface of the second supporting layer 32 to a thickness of, for example 150 nm.

Accordingly, the second supporting layer 32 is formed at a position nearly intermediate between the third low dielectric constant film 23 and the fourth low dielectric constant film 24 which are formed on the interconnections 42.

The upper half of the interlayer insulating film 13, positioned on the upper side of the interconnection layer 41, is composed of the third and fourth low dielectric constant films 23, 24 and the second supporting layer 32, and it has a film thickness similar to the thickness (=600 nm) of a related art interlayer insulating film made of only silicon oxide.

In this way, the interlayer insulating film 13 is composed of the first to fourth low dielectric constant films 21 to 24 and the first and second supporting layers 31, 32.

For the multi-layer interconnection structure, a different interconnection layer (not shown) is formed on the fourth low dielectric constant film 24. Such an interconnection layer is composed of, for example a plurality of interconnections (not shown) disposed on the fourth low dielectric constant film 24.

Accordingly, the third and fourth low dielectric constant films 23, 24 and the second supporting layer 32 form an interlayer insulating film between the interconnection layer 41 and the different interconnection layer (not shown); and the second supporting layer 32 is formed at a position nearly intermediate between the third and fourth low dielectric films 23, 24. In this way, for the multi-layer interconnection structure in which interconnection layers are laminated upward, at least a layer unit including the low dielectric constant film (between interconnections and on interconnections), the low dielectric constant film (under interconnections), and the supporting layer, is repeated, to form an interlayer insulating film.

In the interlayer insulating film 13 for a semiconductor device having the above configuration, the spaces between the interconnections 42 and upper and lower sides of the interconnections 42 are surrounded by the second and third low dielectric films 22, 23 each being made of BCB having a dielectric constant of 2.6, and accordingly the capacity between the interconnections 42 is reduced. Moreover, the first and second supporting layers 31, 32 are respectively formed in the lower half and the upper half (on the upper and lower sides of the interconnections 42) of the interlayer insulating film 13, and accordingly the rigidity of the interlayer insulating film 13 is enhanced.

In addition, the rigidity of an interlayer insulating film in which either the first supporting layer 31 or the second supporting layer 32 is formed is lower than the rigidity of the above-described interlayer insulating film 13 in which both the first and second supporting layers 31, 32 are formed; however, it is higher than the rigidity of an interlayer insulating film composed of only low dielectric constant films each being made of an organic material being low in rigidity.

Next, a method of manufacturing the interlayer insulating film 13 for a semiconductor device according to the first embodiment will be described. Here, parts corresponding to those described in FIG. 1 are indicated by the same characters. In addition, the manufacturing method will be described with reference to FIG. 1.

A substrate 11 is, for example, made of silicon.

Silicon oxide is first deposited on the substrate 11 by, for example chemical vapor deposition (hereinafter, referred to as "CVD"), to form an insulating film 12.

The surface of the insulating film 12 is then coated with a BCB polymer, to form a first low dielectric film 21.

Specifically, the film formation of the first low dielectric film 21 is performed by rotating the substrate 11 at for example 4500 rpm for 2 mins. and simultaneously supplying BCB on the insulating film 12, followed by curing at for example 250° C. for 5 mins. As a result, the first low dielectric film 21, made of BCB, is formed to a thickness of 150 nm.

Subsequently, silicon oxide is deposited on the first low dielectric film 21 to a thickness of for example 300 nm by for example CVD, to form a first supporting layer 31.

A second low dielectric constant film 22 made of BCB is then formed on the first supporting layer 31 to a thickness of for example 150 nm by for example coating. The formation condition for the second low dielectric film 22 is the same as that for the first low dielectric constant film 21.

An interconnection metal layer, made of an aluminum based metal, for forming interconnections is then formed to a thickness of for example 600 nm by for example sputtering.

Subsequently, the interconnection metal layer is patterned by a lithography technique (resist coating, exposure, development, baking and the like) and etching, to form an interconnection layer 41 composed of a plurality of interconnections 42.

A third low dielectric constant film 23 made of BCB is formed by for example coating in such a manner as to cover each interconnection 42 to a thickness of for example 150 nm from the interconnections 42.

Specifically, the film formation of the third low dielectric film 23 is performed by rotating the substrate 11 at for example 3000 rpm for 2 mins. and simultaneously supplying BCB on the second low dielectric constant film 22 on which the interconnection layer 41 is formed, followed by curing at for example 250° C. for 5 mins. As a result, the third low dielectric film 23, made of BCB, is formed to the above thickness.

Silicon oxide is then deposited on the third low dielectric constant film 23 to a thickness of for example 800 nm by for example CVD, to form a second supporting layer 32.

After that, the surface side of the second supporting layer 32 is polished by for example chemical/mechanical polishing, to be thus planarized. At this time, the second supporting layer 32 is kept to have a thickness of at least 300 nm.

A fourth low dielectric constant film 24 made of BCB is formed on the second supporting layer 32 to a thickness of for example 150 nm by for example coating. The formation condition for the fourth low dielectric constant film 24 is the same as that for the first low dielectric film 21.

The interlayer insulating film 13 for the semiconductor device is thus formed.

Figure 2:
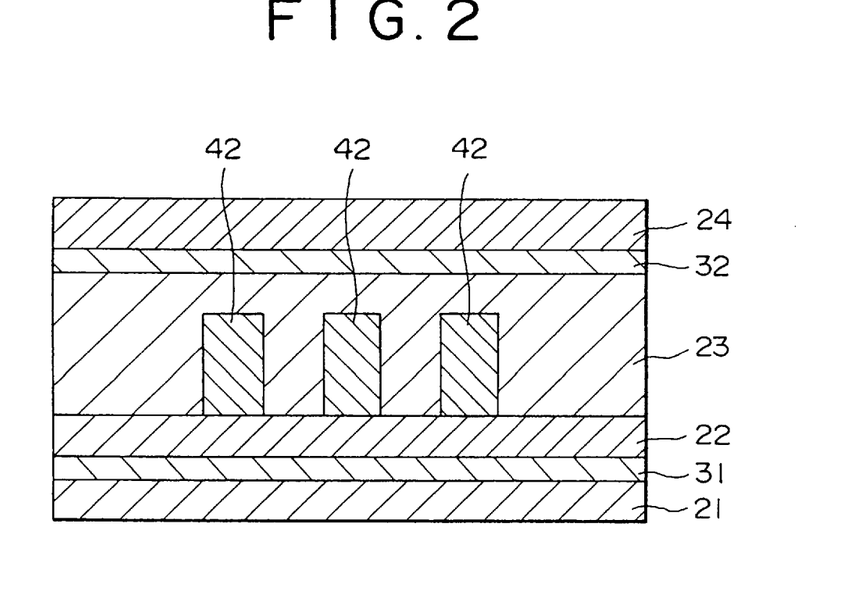
FIG. 2 is a typical sectional view of the first embodiment.

Next, there will be examined a capacitance between interconnections 42 depending on each film thickness of first and second supporting layers 31, 32 each being made of silicon oxide (dielectric constant $\epsilon$=4.0) with respect to the interlayer insulating film 13 having the configuration shown by the schematic view of FIG. 2. In addition, each of the first to fourth low dielectric constant films 21 to 24 shown in FIG. 2 is made of BCB (dielectric constant $\epsilon$=2.6).

Figure 3A:
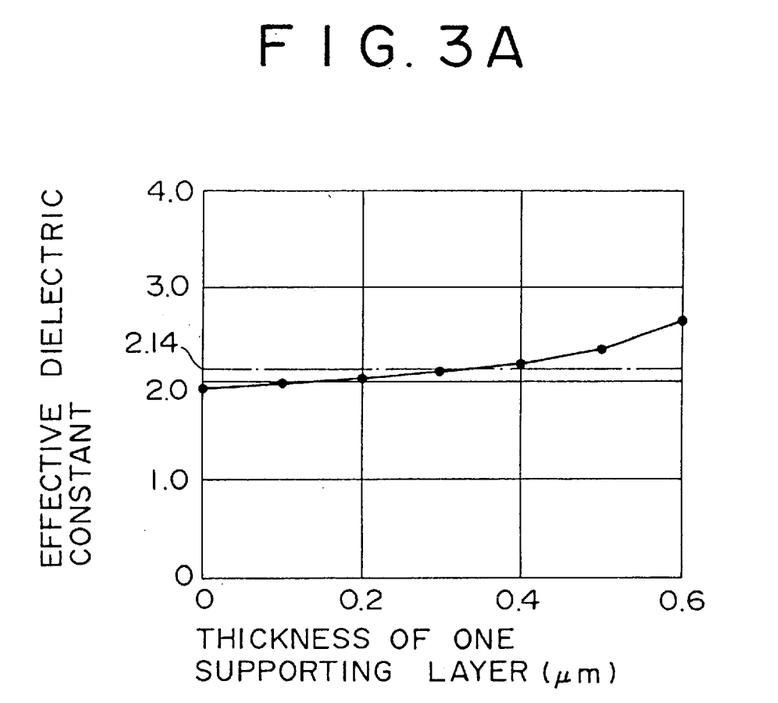
FIGS. 3A and 3B are graphs illustrating a capacitance between interconnections depending on a thickness of a supporting layer.
Figure 3B:
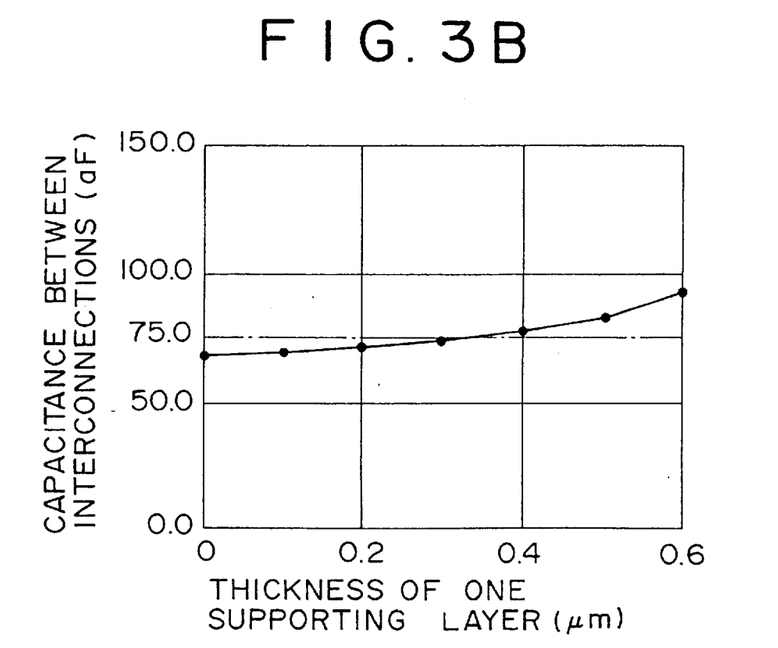

The result is shown in FIGS. 3A and 3B. In FIG. 3A, the ordinate indicates an effective dielectric constant based on the reference dielectric constant (=1.0) of the configuration in which the interconnections are surrounded with air; and the abscissa indicates the thickness of one supporting layer. In FIG. 3B, the ordinates indicates an actual capacitance between interconnections; and the abscissa indicates the thickness of one supporting layer.

As can be seen from FIGS. 3A and 3B, when the thickness of the silicon oxide film is about in a range of from 0 to 400 nm, the capacitance between interconnections is little affected by the thickness of the silicon oxide film and consequently it exhibits a low value. However, when the thickness of the silicon oxide film is about more than about 400 nm, the effective dielectric constant (capacitance between interconnections) becomes higher than the effective dielectric constant=2.14 [(capacitance between interconnections=75 aF (atto Farad)] of the configuration in which the iterlayer insulating film is all formed of the low dielectric constant films.

Accordingly, the thickness of each of the first and second supporting layers 31, 32 is required to be 400 nm or less, and is desirable to be about 300 nm in consideration of the rigidity of the interlayer insulating film 13.

Comparative Example will be described below with reference to FIG. 4.

Figure 4:
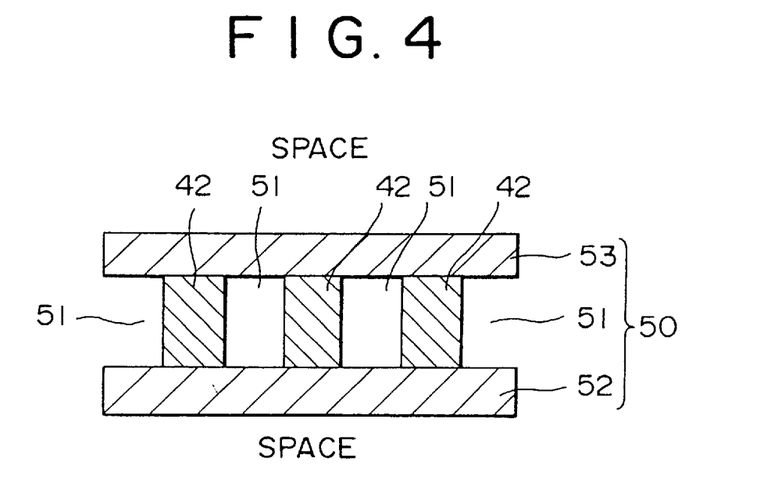
FIG. 4 is a view illustrating an interlayer insulating film as a comparative example.

As shown in FIG. 4, an interlayer insulating film 50 is obtained in such a manner that cavities 51 are formed between interconnections 42 similar to those shown in FIG. 2 and silicon oxide films 52, 53 are respectively formed on the lower and upper sides of the interconnections 42. In addition, the surroundings of the interlayer insulating film 50 become spaces. The capacitance between interconnections in such an interlayer insulating film 50 in which the thickness of each silicon oxide films 52, 53 is varied from 0 to 1.0 $\mu$m will be described with reference to FIG. 5.

Figure 5A:
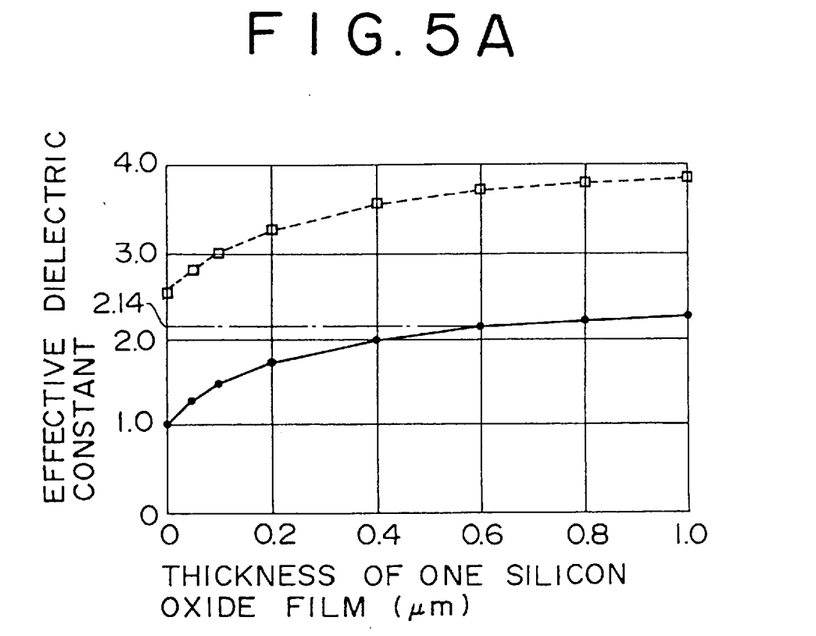
FIGS. 5A and 5B are graphs illustrating a capacitance between interconnections depending on a thickness of a silicon oxide film in the comparative example.
Figure 5B:
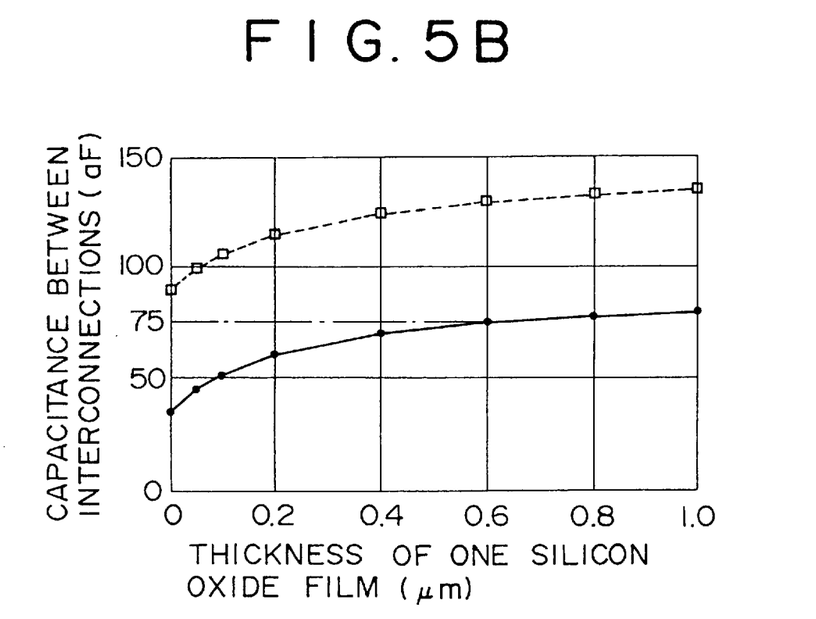

In FIG. 5A, the ordinate indicates an effective dielectric constant based on the reference dielectric constant (=1.0) of the configuration in which the interconnections are surrounded with air; and the abscissa indicates the thickness of one silicon oxide film. In FIG. 5B, the ordinates indicates an actual capacitance between interconnections; and the abscissa indicates the thickness of one silicon oxide film.

Even in the case where the cavities 51 are formed between the interconnections 42, the effective dielectric constant (capacitance between interconnections) is increased up to 2.14 (75 aF) by the effect of the silicon oxide films 52, 53 provided on the lower and upper sides of the interconnections 42 when the thickness of each of the silicon oxide films 52, 53 becomes 0.6 $\mu$m, as shown in FIGS. 5A, 5B.

In addition, a broken line in each of FIGS. 5A, 5B shows a comparative effective dielectric constant (capacitance between interconnections) depending on a thickness of each of the silicon oxide films 52, 53 in the interlayer insulating film in which spaces between the interconnections 42 are buried with the silicon oxide film.

On the contrary, in the configuration of the first embodiment described with reference FIG. 1, even when each of the first and second low dielectric constant films 21, 22 under the interconnections 42 and the third and fourth low dielectric constant films 23, 24 on the interconnections 42 is taken as 300 nm and each of the first and second supporting layers 31, 32 made of silicon oxide is taken as 300 nm, the same effective dielectric constant can be substantially obtained.

Figure 6:
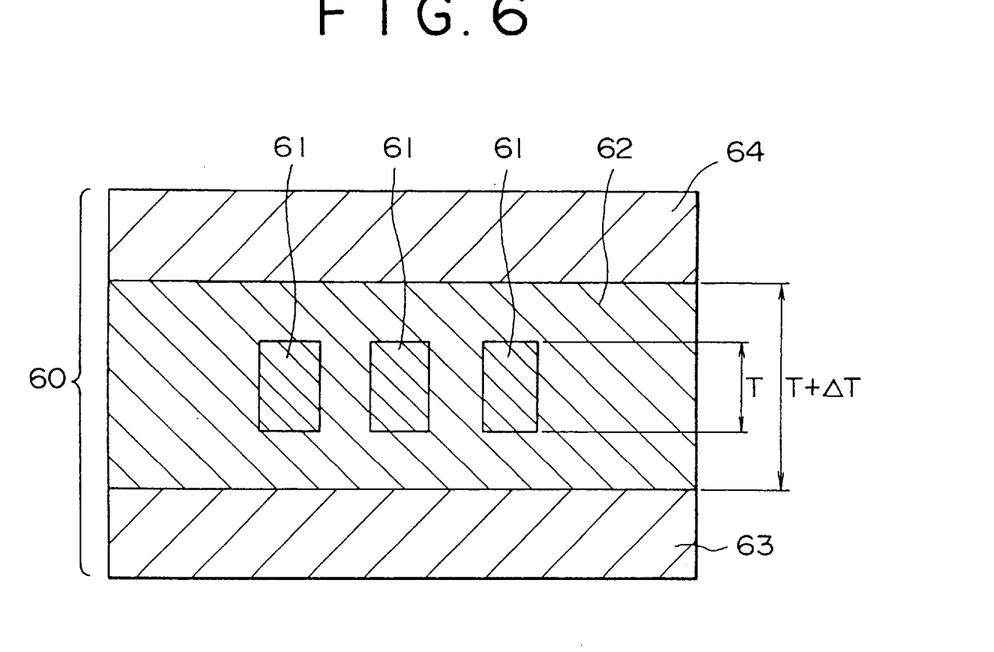
FIG. 6 is a view illustrating a modification of the first embodiment.

Next, modifications of the first embodiment will be described with reference to FIGS. 6 and 7. FIG. 6 shows an interlayer insulating film 60; and FIG. 7 shows an interlayer insulating film 70.

The interlayer insulating film 60 shown in FIG. 6 has a structure in which a low dielectric constant film 62 is formed in surroundings and between interconnections 61 (similar to the interconnections 42). The low dielectric constant film 62 is made of a carbon based polymer having a dielectric constant of 2.5.

The interlayer insulating film 60 further includes supporting layers 63, 64 formed of silicon oxide having a dielectric constant of 4 by CVD, in addition to the low dielectric constant film 61. Moreover, each of the interconnections 61 is formed of aluminum and has a cross-section of 0.3 $\mu$m (width)×0.3 $\mu$m (thickness). Now, it is assumed that the thickness of the interconnection 61 is taken as T and the thickness of the low dielectric constant film 62 is taken as (T+$\Delta$T).

Figure 7:
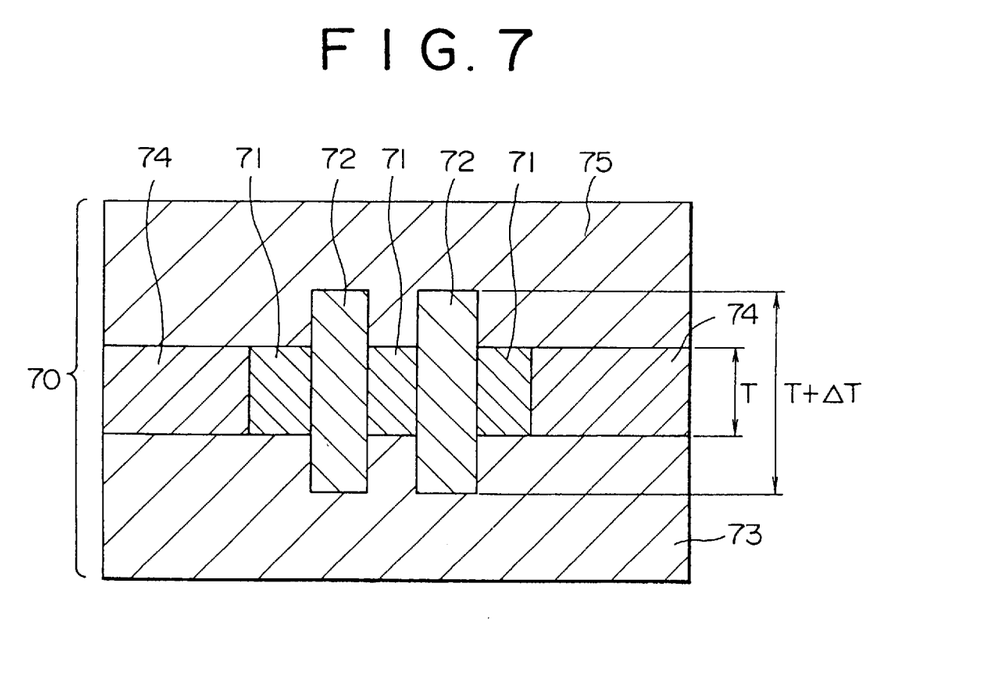
FIG. 7 is a view illustrating an interlayer insulating film as another comparative example.

On the other hand, the interlayer insulating film 70 shown in FIG. 7 has a structure in which a low dielectric constant film 72 is formed only between interconnections 71 (similar to the interconnections 42 of FIG. 1). The low dielectric constant film 72 is made of a carbon based polymer having a dielectric constant of 2.5.

The interlayer insulating film 70 further includes silicon oxide films 73, 74 and 75 formed of silicon oxide having a dielectric constant of 4 by CVD, in addition to the low dielectric constant film 71. Moreover, each of the interconnections 71 is formed of aluminum, and has a cross-section of 0.3 $\mu$m (width)×0.3 $\mu$m (thickness). Now, it is assumed that the thickness of the interconnection 71 is taken as T and the thickness of the low dielectric constant film 72 is taken as (T+$\Delta$T).

Figure 8:
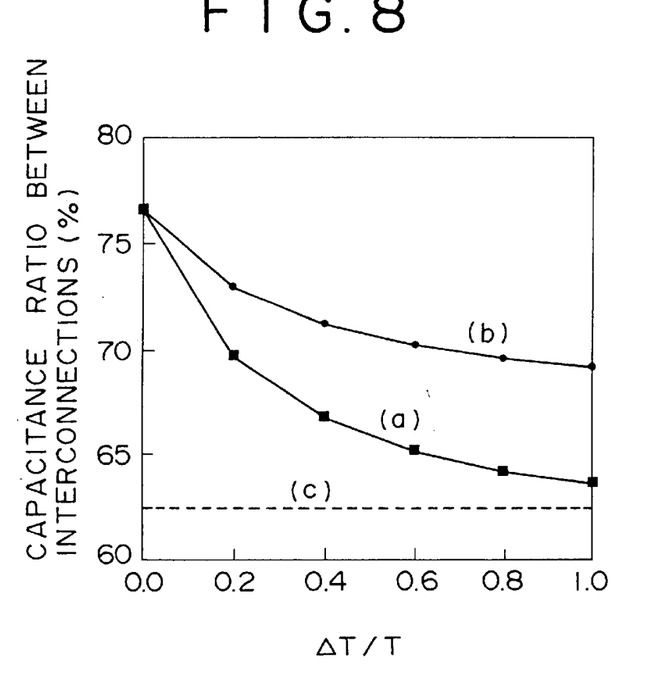
FIG. 8 is a graph illustrating a capacitance ratio between interconnections depending on ΔT/T.

Next, capacitance ratios between interconnections with respect to $\Delta$T/T of the interlayer insulating films 60, 70 shown in FIGS. 6, 7 will be described with reference to FIG. 8. Referring to FIG. 8, a curve (a) shows a capacitance ratio between interconnections with respect to $\Delta$T/T of the interlayer insulating film 60 shown in FIG. 6; and a curve (b) shows a capacitance ratio between interconnections with respect to $\Delta$T/T of the interlayer insulating film 70 shown in FIG. 7. In these figures, the ordinate indicates a capacitance ratio between interconnections in each interlayer insulating film based on the capacitance (100%) of the configuration in which the interlayer insulating film is all made of silicon oxide; and the abscissa indicates $\Delta$T/T shown in FIGS. 6, 7.

In addition, a broken line (c) in FIG. 8 shows a capacitance ratio between interconnections in the configuration in which the interlayer insulating film is all made of a low dielectric constant film.

As shown in FIG. 8, the capacitance between interconnections in the related art configuration in which the low dielectric constant film 72 is used only between the interconnections 71 is not reduced so much even when the thickness of the low dielectric film 72 is made thick. On the contrary, in the case of the interlayer insulating film 60 in which the low dielectric constant film is formed in surroundings and between the interconnections 61, the capacitance can be reduced even when the thickness of the low dielectric constant film 62 is not made thick as shown in FIG. 7.

Accordingly, the configuration shown in FIG. 6 also makes it possible to reduce the capacitance between interconnections and suppress the amount of the low dielectric constant film, and to make smaller the effect on the reliability using the related art silicon oxide film in a large amount.

Next, a second embodiment will be described with reference to a schematic view of FIG. 9. In this figure, parts corresponding to those described in FIG. 1 are indicated by the same characters.

Figure 9:
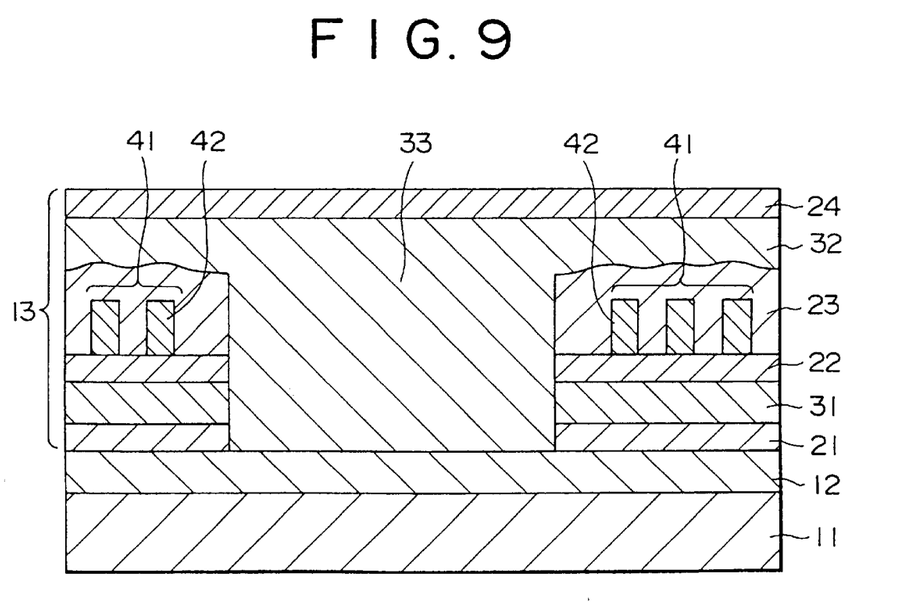
FIG. 9 is a schematic sectional view of the configuration of a second embodiment of the present invention.

As shown in FIG. 9, the structure of an interlayer insulating film 13 in the vertical direction of an interlayer insulating layer 41 is similar to that described in the first embodiment. Namely, a first low dielectric constant film 21, a first supporting layer 31 and a second low dielectric constant film 22 are sequentially laminated on an insulating film 12 formed on a substrate 11, and an interconnection layer 41 is formed on the second low dielectric constant film 22. Moreover, a third low dielectric constant film 23, a second supporting layer 32 and a fourth low dielectric constant film 24 are formed in such a manner as to cover the interconnection layer 41.

A supporting portion 33 connected to the first and second supporting layers 31, 32 is formed nearly at a central portion of a space between the interconnections 42 which is wider than the minimum pitch of the interconnections 42 of the interconnection layer 41. The space between the interconnections in which the supporting portion 33 is formed may be about three times the minimum pitch of the interconnections 42 or more. In addition, it is desirable that the supporting portion 33 is separated from the nearest interconnection 42 by a distance being about three times the minimum space between the interconnections 42.

In the second embodiment, the strength of the interlayer insulating film 13 can be enhanced by the supporting portion 33 formed between the first and second supporting layers 31, 32.

The formation method of the second embodiment will be described below.

An insulating film 12 is formed on a substrate 11, and then a first low dielectric constant film 21, a first supporting layer 31 and a second low dielectric constant film 22 are formed on the insulating film 12, like the formation method of the first embodiment. A third low dielectric constant film 23 is then formed in such a manner as to cover the interconnection layer 41.

The first to third low dielectric constant films 21 to 23 and the first supporting layer 31 in a wide space between interconnections 42 are removed by a lithography technique (for example, resist coating, exposure, development, baking and the like) and etching (for example, dry etching). At this time, the removal portion is separated from the interconnections 42 by a distance being at least about three times the minimum space between the interconnections 42 for preventing the exposure of the interconnections 22.

Silicon oxide for forming a second supporting layer 32 is then deposited to a thickness of for example 800 nm by CVD, to bury the removed portion with silicon oxide for forming the supporting portion 33, and to form the second supporting layer 32 on the third low dielectric constant film 23.

After that, the surface side of the second supporting layer 32 is polished by for example chemical/mechanical polishing, to be thus planarized. At this time, the second supporting layer 32 is kept to have a thickness of at least 300 nm from the third low dielectric constant film 23.

A fourth low dielectric constant film 24 made of BCB is formed on the second supporting layer 32 to a thickness of for example 150 nm by a coating in the same condition as that used for forming the first low dielectric constant film 21.

An interlayer insulating film 13 for a semiconductor in which the supporting portion 33 is provided, is thus formed.

Although each of the first to fourth low dielectric constant films 21 to 24 is made of BCB in the first and second embodiments, it may be made of a polyimide fluoride, a polymer expressed by a chemical formula (1), polyparaxylylene, or a fluorocarbon based material (for example, expressed by a chemical formula (2)). The above material can be formed by coating.

wherein R is $CH_3$ or $C_2H_4$.

wherein F in the parenthesis can be replaced with $CF_3$.

Although each of the first and second supporting layers 31, 32 and the supporting portion 33 is made of silicon oxide in the first and second embodiments, it may be made of a silicon oxide based material such as a silicon oxide containing nitrogen (SiON), silicon oxide containing fluorine (SiOF), silicon oxide containing boron (SiOB), silicon oxide containing phosphorous (SiOP), silicon oxide containing boron and nitrogen (SiOBN), silicon oxide containing arsenic (SiOAs); or silicon nitride (SiN). Moreover, it may be formed of a laminated film containing one or more kinds of these materials including silicon oxide.

The interlayer insulating film 13 of each of the first and second embodiments, which partially includes low dielectric constant films, significantly improves the reliability (film strength, stress, oxygen plasma resistance and the like) which has been at stake in the related art structure having the interlayer insulating film 13 all formed of a low dielectric constant film.

In particular, the problem of the reliability in terms of the film strength can be almost solved by the structure of the second embodiment in which not only a supporting layer is formed in interconnection layers but also the supporting portion 33 is formed in a wide space between the interconnections 42.

According to the present invention, low dielectric constant films each having a dielectric constant of from 1 to 3.5 is formed in surroundings and between interconnections, so that a capacitance between interconnections in an interlayer insulating film can be reduced, to thereby improve an operating speed of a semiconductor device. Moreover, since a supporting layer is formed in or through at least one of low dielectric constant films formed on the upper and lower sides of the interconnections, the rigidity of the interlayer insulating film can be improved by the presence of the supporting layer.

While the embodiments of the present invention have been described, such description is for illustrative purposes only, and it is to be understood that changes and variations may be made without departing from the spirit or scope of the following claims.

What is claimed is:

1. An interlayer insulating film for a semiconductor device, which is formed in such a manner as to cover surroundings of interconnections formed in interconnection layers on the semiconductor device, comprising:

low dielectric constant films, each having a dielectric constant of from 1 to 3.5, which are formed in surroundings of said interconnections and between said interconnections; and a supporting layer, formed in or through at least one of said low dielectric constant films formed on the upper and lower sides of said interconnections, comprising a supporting portion at a nearly central portion of a space between interconnections which is wider than a pitch of any one of said interconnection layers, said supporting portion being separated from a nearest interconnection by a distance that is about three times a space between the interconnections in any of said interconnection layers.

2. An interlayer insulating film for a semiconductor device according to claim 1, wherein said supporting layer is provided at a position nearly intermediate between a first of said interconnection layers in which said interconnections are disposed in a layer structure and a second of said interconnection layers provided on an upper or lower side of said first of said interconnection layers.

3. An interlayer insulating film for a semiconductor device according to claim 1, wherein said space between interconnections in which said supporting portion is formed is more than three times a minimum pitch of any one of said interconnections of one interconnection layer.

4. An interlayer insulating film for a semiconductor device, which is formed in such a manner as to cover surroundings of interconnections formed in interconnection layers on the semiconductor device, comprising:

low dielectric constant films, each having a dielectric constant of from 1 to 3.5, which completely surround said interconnection layers, and entirely fill a gap between each of said interconnections within any of said interconnection layers; and a supporting layer formed in or through at least one of said low dielectric constant films that are formed on an upper and a lower side of each of said interconnections layers, and separated from a nearest interconnection by a distance that is about three times a space between the interconnections in any of said interconnection layers.

5. An interlayer insulating film for a semiconductor device according to claim 4, wherein said supporting layer is provided at a position nearly intermediate between a first of said interconnection layers in which said interconnections are disposed in a layer structure and a second of said interconnection layers provided on an upper or lower side of said first of said interconnection layers.

6. An interlayer insulating film for a semiconductor device according to claim 4, wherein said supporting layer is provided with a supporting portion, which is connected to said supporting layer, at a nearly central portion of a space between interconnections which is wider than the minimum pitch of said interconnections of one interconnection layer.

7. An interlayer insulating film for a semiconductor device according to claim 5, wherein said supporting layer is provided with a supporting portion, which is connected to said supporting layer, at a nearly central portion of a space between interconnection layers which is wider than the minimum pitch of any of said interconnections of one interconnection layer.

8. An interlayer insulating film for a semiconductor device according to claim 6 or 7, wherein said space between interconnections in which said supporting portion is formed is more than three times a minimum pitch of any one of said interconnections of one interconnection layer.

9. An interlayer insulating film for a semiconductor device according to claim 1 or 4, wherein said low dielectric constant films comprise polyimide fluoride.

10. An interlayer insulating film for a semiconductor device according to claim 1 or 4, wherein said low dielectric constant films comprise a polymer expressed by a chemical formula (1)

wherein R is $CH_3$ or $C_2H_4$.

11. An interlayer insulating film for a semiconductor device according to claim 1 or 4, wherein said low dielectric constant films comprise polyparaxylylene.

12. An interlayer insulating film for a semiconductor device according to claim 1 or 4, wherein said low dielectric constant films comprise a fluorocarbon based material.

13. An interlayer insulating film for a semiconductor device according to claim 2, wherein said fluorocarbon based material comprises a compound expressed by a chemical formula (2)

wherein F in the parenthesis can be replaced with $CF_3$.

* * * * *